(12) United States Patent
Okushima

(10) Patent No.: US 7,112,852 B2
(45) Date of Patent: Sep. 26, 2006

(54) SEMICONDUCTOR DEVICE

(75) Inventor: Mototsugu Okushima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/127,550

(22) Filed: Apr. 23, 2002

(65) Prior Publication Data
US 2002/0153533 A1 Oct. 24, 2002

(30) Foreign Application Priority Data
Apr. 24, 2001 (JP) ............... 2001-126087

(51) Int. Cl.
H01L 23/62 (2006.01)
(52) U.S. Cl. ............ 257/360; 257/363; 257/358; 257/E27.033
(58) Field of Classification Search ........ 257/360–362, 257/358, 355–357, 363, E27.033
See application file for complete search history.

(56) References Cited

U.S. PATENT DOCUMENTS

| 4,682,404 | A | * | 7/1987 | Miller et al. ............. 438/306 |
| 5,663,082 | A | * | 9/1997 | Lee ........................ 438/234 |
| 6,072,219 | A | * | 6/2000 | Ker et al. ................ 257/355 |
| 6,175,139 | B1 | * | 1/2001 | Horiguchi et al. ......... 257/401 |
| 6,268,256 | B1 | * | 7/2001 | Kuo ...................... 438/305 |
| 6,351,362 | B1 | * | 2/2002 | Inoue et al. ............. 361/111 |
| 6,455,898 | B1 | * | 9/2002 | Liu et al. ................ 257/360 |
| 6,495,437 | B1 | * | 12/2002 | Yu ....................... 438/591 |
| 2002/0149059 | A1 | * | 10/2002 | Ker et al. ............... 257/355 |

FOREIGN PATENT DOCUMENTS

JP 63-202056 8/1988

OTHER PUBLICATIONS

Ajith Amerasekera and Charvaka Duvvury, "The Impact of Technology Scaling on ESD Robustness and Protection Circuit Design", IEEE Transactions on Components, Packaging, and Manufacturing Technology—Part A, vol. 18, No. 2, Jun. 1995, pp. 314-320.

* cited by examiner

Primary Examiner—Kenneth Parker
Assistant Examiner—Matthew C. Landau
(74) Attorney, Agent, or Firm—McGinn IP Law Group, PLLC

(57) ABSTRACT

The electrostatic protection device provided between an input/output terminal and an internal circuit of a semiconductor device according to the present invention has a first insulated gate field effect transistor (MOS transistor) and a second MOS transistor that are connected mutually in parallel between an input/output wiring connected to the input/output terminal and an electrode wiring of a prescribed potential, where the first MOS transistor and the second MOS transistor are MOS transistors of the same channel type, the second MOS transistor has s higher drive capability than the first MOS transistor, and the electrostatic protection device is formed such that it is started by the first MOS transistor.

10 Claims, 9 Drawing Sheets

SEMICONDUCTOR DEVICE

BACKGROUND OF THE INVENTION

1. Field of the Invention

The present invention relates to a semiconductor device, and more particularly to a semiconductor device equipped with an electrostatic protection device for protecting an internal circuit from electrostatic breakdown.

2. Description of the Prior Art

A semiconductor integrated circuit formed on a semiconductor substrate is constituted by semiconductor elements such as insulated gate field effect transistor (called MOS transistor) Accordingly, it is indispensable to protect the semiconductor elements from breakdown caused by an excessively high external input voltage, such as a pulse-like high voltage generated by electrostatic discharge (ESD), that is applied momentarily. In the past, there have been proposed and actually adopted various kinds of techniques to protect the semiconductor circuits from ESD breakdown.

Along with the high integration processing, lowering of the operating voltage and the low power consumption, of the semiconductor device, the structure of the semiconductor elements that constitute the semiconductor devices is made further refined and high density. As a result, generally speaking, electrostatic breakdown of semiconductor devices, in particular MOS transistors that have been rendered refined and high density, is apt to occur more frequently.

Moreover, in the process of refinement of the semiconductor device, it is normal to set the operating voltage of the peripheral circuit of the semiconductor device to be higher than that of the internal circuit. For example, the operating voltage of the peripheral circuit is set at 3.3 V while that of the internal circuit is set at about 1.2 V. In compliance with this, the gate insulation film of a MOS transistor constituting the peripheral circuit is set thicker than that of the MOS transistor constituting the internal circuit. In addition, the lightly doped drain (LDD) structure for enhancing the resistance to hot electrons is still required for the MOS transistor constituting the peripheral circuit. In contrast, since the operating voltage is at a low level of about 1 V for the internal circuit, the problem of hot-electrons in the MOS transistor is nonexistent. Even in such a case where the MOS transistors that constitute the semiconductor device are given different operating conditions for those in the peripheral circuit and those in the internal circuit, electrostatic breakdown is apt to occur in the MOS transistors of the peripheral circuit due to the formation of the LDD structure or its formation using a silicide.

As conventional electrostatic protection devices for protecting the semiconductor integrated circuit from ESD breakdown, a technique disclosed in Japanese Patent Applications Laid Open, No. Sho 63-202056 (referred to as first prior art hereinafter), a technique which is adopted generally (referred to as second prior art hereinafter) and a technique proposed lately (referred to as third prior art hereinafter) will be described briefly. The third prior art is the technique disclosed in IEEE Transactions on Components, Package, and Manufacturing Technology, Part A, Vol. 18, No. 2, June 1995, pp. 314–320.

FIG. 9A shows an equivalent circuit diagram of an input protection part that acts as an electrostatic protection device in the first prior art, and FIG. 9B shows a sectional view of semiconductor element of the input protection part.

As shown in FIG. 9A, an input wiring 102 is connected to an input terminal 101, and the wiring 102 is to be connected to an input gate of an internal circuit of the semiconductor device. An N-channel MOS transistor 103 for input protection as an electrostatic protection transistor is connected between the input wiring 102 and a potential Vss (ground potential). The gate of the N-channel MOS transistor 103 for input protection is fixed to the Vss potential.

Such an input protection part is constituted by one MOS transistor with large size. However, if a high pulse voltage is applied to this MOS transistor, the MOS transistor operates as a bipolar transistor. Because of this, in FIG. 9A it is depicted as if there exists also a parasitic NPN transistor between the input wiring 102 and the Vss potential.

The N-channel MOS transistor 103 for input protection, which is a single piece of MOS transistor that actually constitutes the protection circuit, is formed in a semiconductor substrate 105 of P-type conductivity, as shown in FIG. 9B. It is formed such that a gate electrode 107 surrounds an $N^+$ diffused layer 106 for drain that is connected to the input terminal 101, and an $N^+$ diffused layer 108 for source surrounds the gate electrode 107.

In this case, the parasitic NPN transistor 104 is apparently formed as indicated by broken lines in FIG. 9B. Namely, the semiconductor substrate 105 serves as the base, the $N^+$ diffused layer 108 for source serves as the emitter, and the $N^+$ diffused layer 106 for drain serves as the collector, of the parasitic NPN transistor 104. The $N^+$ diffused layer 108 for source is connected to the potential Vss, and an input terminal made of a metal pad is formed on the $N^+$ diffused layer 106 for drain.

In this manner, a single piece of MOS transistor with large size is formed as a semiconductor element for input protection of the first prior art.

Next, referring to FIG. 10, which shows an equivalent circuit of an input protection part that acts as the electrostatic protection device of the second prior art will be described.

As shown in FIG. 10, a resistance wiring 202 is connected to an input terminal 201, where the wiring 202 is to be connected to the input gate of an internal circuit of the semiconductor device. APN diode 203 for input protection and an NPN transistor 204 are connected so as to be mutually parallel between the resistance wiring 202 and the Vss potential.

The NPN transistor 204 may be configured using, for example, slender $N^+$ diffused layers that are formed in parallel and mutually adjacently on a P-type conductivity semiconductor substrate, though not illustrated in the figure. Here, the NPN transistor is a lateral bipolar transistor in which one of the diffused layers serves as the emitter, the other diffused layer serves as the collector, and the surface of the semiconductor substrate of P-type conductivity between these electrodes serves as the base.

Moreover, the PN diode 203 for input protection is formed by the other $N^+$ diffused layer in the above and the semiconductor substrate. The equivalent circuit in FIG. 10 is formed according to the manner described in the above.

Referring to FIG. 11, which shows an equivalent circuit of an input protection part being the electrostatic protection device of the third prior art, this prior art will be described next.

As shown in FIG. 11, an input wiring 302 is connected to an input terminal 301, and the wiring 302 is to be connected to the input gate of an internal circuit of the semiconductor device. An N-channel MOS transistor for input protection 303 is connected between the input wiring 302 and the Vss potential to work as an electrostatic protection transistor. In addition, a coupling capacitor 304 and a resistor 305 are connected between the input wiring 302 and the Vss potential. After this arrangement, the gate electrode of the N-channel MOS transistor 303 is connected to a point between the coupling capacitor 304 and the resistor 305.

It is to be noted that the electrostatic protection devices shown in the conventional techniques described in the above are applicable similarly to the output protection part.

As has been mentioned in the above, semiconductor devices are made to operate fast as well as to have high integration. As a result, individual semiconductor elements that constitute the semiconductor device are made more refined and high density than ever. In this way, with the advancement in the refinement of the semiconductor devices, occurrence of defects in the semiconductor devices due to ESD breakdown increases in general.

Moreover, low power consumption is indispensable for the semiconductor devices so that lowering of the voltages during the operation becomes the more important. When the lowering of the voltage is pursued in this manner, the semiconductor elements constituting the internal circuit undergo breakdown more easily even in the case of smaller quantity of static electricity or lower level of excessive input voltage compared with the conventional case.

Furthermore, for the products of semiconductor devices, the operating voltage of the peripheral circuit is set higher than that of the internal circuit as has been mentioned above. In compliance with this, the LDD structure, which enhances the resistance to the hot electrons, is still required for the source-drain diffused layer of the MOS transistors that constitute the peripheral circuit. Because of this, electrostatic breakdown of the MOS transistors of the peripheral circuit is especially prone to happen. Under such a technical trend, development of a technology for protecting the semiconductor elements from ESD breakdown or the like is needed urgently even than ever.

In the first prior art, a single piece of MOS transistor with large size is formed in the vicinities of the input terminal 101 as an electrostatic protection transistor. When an excessive input voltage is applied to the $N^+$ diffused layer 106 for drain through the input terminal 101, an avalanche breakdown occurs at the P-N junction part between the $N^+$ diffused layer 106 for drain directly below the gate electrode 107 and the semiconductor substrate. In this case, the breakdown generates a large number of holes that constitute a majority carrier. The holes shifts the substrate potential toward the positive side, and operates the MOS transistor by means of the snap-back effect due to the bipolar action. This induces a discharge dealing with the excessive input voltage.

However, the breakdown at the P-N junction normally occurs locally in the first prior art. Because of this, in the MOS transistor with large size, the bipolar operation starts in the region where the above breakdown took place first, resulting in a nonuniform occurrence within the MOS transistor. Result is that the region at which the bipolar operation occurred first suffers an electrostatic breakdown. The nonuniformity of the bipolar operation reveals itself more readily if the MOS transistor is equipped with the LDD structure. The reason for this is that when the source-drain region of the MOS transistor has the LDD structure, the breakdown voltage becomes higher and the local breakdown is apt to occur more easily.

Moreover, in this prior art, the dielectric breakdown of the gate insulation film of the MOS transistor occurs more frequently. In particular, the dielectric breakdown becomes conspicuous with the decrease in the thickness of the gate insulating film that accompanies the refinement of the semiconductor element. The reason for easy occurrence of the dielectric breakdown is considered to be the injection and storage of a large number of holes in the gate insulation film from the semiconductor substrate whose voltage is shifted to the positive side and where numerous holes are generated, during discharge against the excessive input voltage, resulting in the application of an excessive voltage to the gate insulation film.

Furthermore, in the second prior art, the NPN transistor 204 or the like is formed by using a pair of $N^+$ diffused layers formed selectively on the semiconductor substrate as the emitter and the collector regions, and the portion of the semiconductor substrate bounded by these regions as the base region. When an excessive input voltage is applied to the input terminal, the base potential is raised due to the holes generated by the avalanche breakdown, and the NPN transistor is activated. The discharge dealing with the excessive input voltage is carried out through the NPN transistor.

In this case, however, the activation of the NPN transistor, which is a lateral bipolar transistor, takes place somewhat delayed compared with the MOS transistor such as one in the first prior art. Because of this, the response of the electrostatic protection device against the excessive input voltage applied to the input terminal from the outside is delayed. In contrast, the response of the semiconductor element constituting the internal circuit is the more quickened because the element is made more refined. As a result, the semiconductor element of the semiconductor device tends to be broken down prior to the electrostatic protection device starts its function.

Moreover, in this case, such a protection device becomes no longer able to respond to the situation when the level of the excessive input voltage is reduced. This is because the reduction in the avalanche breakdown voltage of the P-N junction becomes difficult. In contrast, when the MOS transistor constituting the internal circuit of the semiconductor device is refined, its gate length is decreased and the thickness of the gate insulation film is reduced as described in the above, the MOS transistor becomes capable of responding satisfactorily even to such a small pulse voltage, and tends to generate an ESD breakdown.

In this way, at present, the breakdown voltage of the P-N junction tends to be on the high side deviating from the scaling rule of the refinement of the semiconductor element, and dielectric breakdown of the gate insulation film tends to occur before the avalanche breakdown of the P-N junction or the ensuing snap-back breakdown that accompanies the bipolar operation takes place.

In the electrostatic protection device of the third prior art, when a high pulse voltage due to static electricity or the like is applied to the input terminal 301, the potential of the gate electrode of the MOS transistor goes up momentarily through the coupling capacitor. Then, the N-channel MOS transistor 303 for input protection is brought to the on-state (conduction state), and an ESD via the N-channel MOS transistor 303 for input protection takes place. Here, the momentary voltage of the gate electrode can be controlled by the adjustment of the resistance of the resistor 305. In this way, the drive capability of the MOS transistor can be adjusted by the ESD.

The third prior art is effective when the reduction of the avalanche breakdownvoltage of the P-N junction becomes difficult. Nonetheless, a highvoltage is applied, though it maybe momentary, to the gate electrode of the N-channel MOS transistor 303 for input protection. Owing to this, the gate insulation film of the N-channel MOS transistor 303 for input protection changes with the lapse of time and is deteriorated. Moreover, in this case, the N-channel MOS transistor 303 for input protection cannot be used as an output buffer at the same time.

BRIEF SUMMARY OF THE INVENTION

OBJECT OF THE INVENTION

It is the object of the present invention to provide a semiconductor device which can protect a refined semiconductor element of the internal circuit from the electrostatic breakdown phenomenon by adopting a circuit configuration with a minimum pattern area.

SUMMARY OF THE INVENTION

An electrostatic protection device according to the present invention provided between an input/output terminal and an internal circuit of a semiconductor device has a first insulated gate field effect transistor (MOS transistor) and a second MOS transistor that are connected in parallel with each other between an input/output wiring connected to the input/output terminal and an electrode wiring with a prescribed potential, where the first MOS transistor and the second MOS transistor are MOS transistors of the same channel type, the second MOS transistor has a higher drive capability than the first MOS transistor and the electrostatic protection device is formed in such a way as to be activated by the first MOS transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
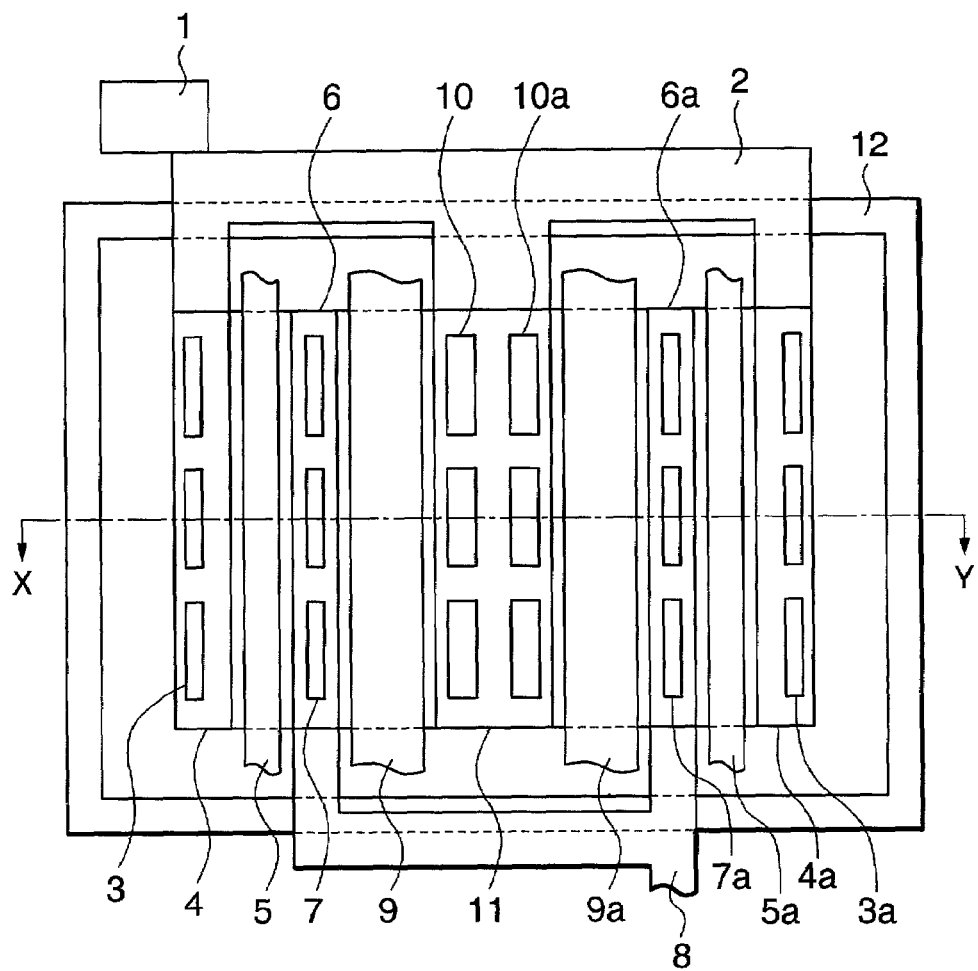
FIGS. 1A and 1B are a plan view and a schematic sectional view, respectively, of an input/output protection part for describing a first embodiment of the present invention.
Figure 1B:
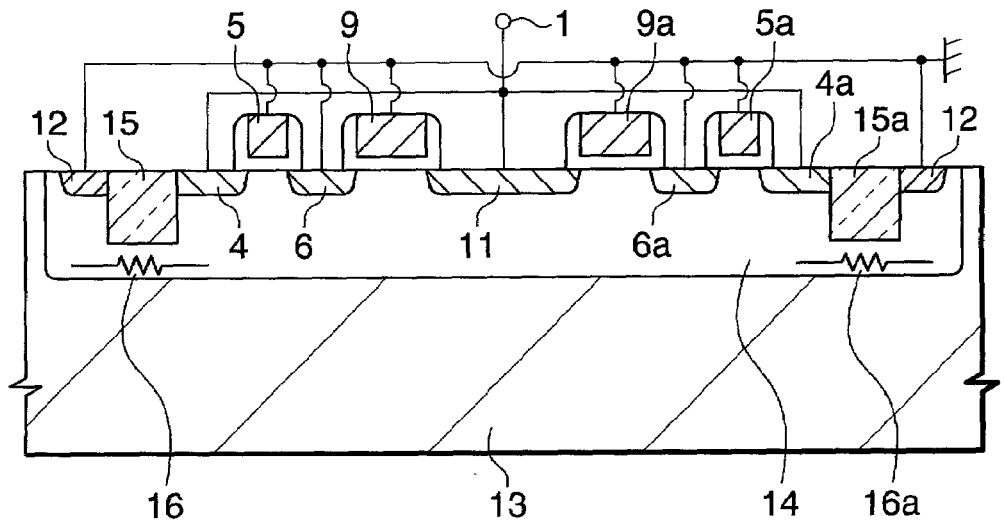
Figure 2:
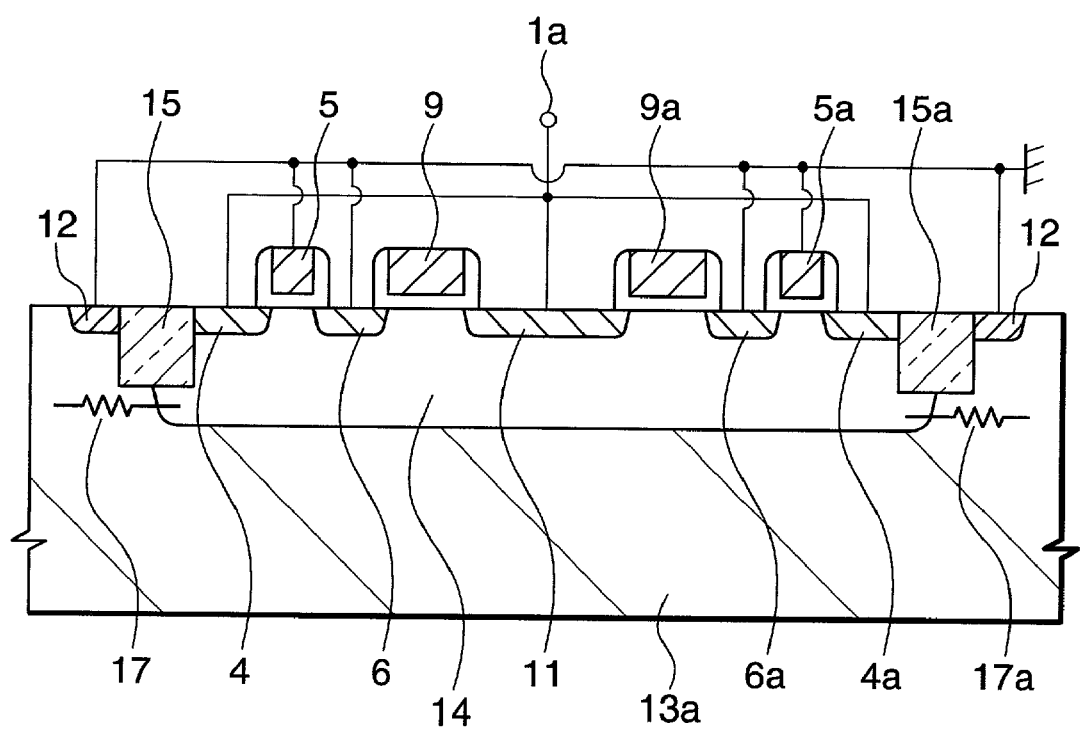
FIG. 2 is another schematic sectional view of the output protection device for describing the output protection part of the first embodiment according to the invention.

Referring to FIG. 1 to FIG. 5, a first embodiment according to the present invention will be described. FIG. 1A is a plan view of the pattern layout of an input/output protection part which serves as an electrostatic protection device of this invention, and FIG. 1B is a schematic sectional view as seen in the direction X-Y indicated in FIG. 1A. Besides, FIG. 2 is another example of a schematic sectional view as seen in the direction of X-Y in FIG. 1A.

As shown in FIG. 1A, an input/output wiring 2 which is connected to an input/output terminal 1 is formed. The input/output wiring 2 is connected to drain diffused layers 4 and 4a via drain contact holes 3 and 3a of two trigger MOSFETs which constitute a first MOS transistor. Source contact holes 7 and 7a are provided respectively on source diffused layers 6 and 6a formed in between the gate electrodes of the trigger FETs, namely, in between trigger gate electrodes 5 and 5a, and the source diffused layers 6 and 6a are connected to a ground wiring 8 via the source contact holes 7 and 7a.

Moreover, the input/output wiring 2 is connected to a drain diffused layer 11 via drain contact holes 10 and 10a of protection MOSFETs that have gate electrodes 9 and 9a for protection transistors, as shown in FIG. 1A. The source diffused layers 6 and 6a are connected to the ground wiring 8 via the source contact holes 7 and 7a on the source diffused layers 6 and 6a formed in between the gate electrodes 9 and 9a for protection transistors. Here, the protection MOSFETs serve as a second MOS transistor.

Furthermore, the gate electrodes of the trigger MOSFETs and the protection MOSFETs, namely, the gate electrodes 5 and 5a for trigger, and the gate electrodes 9 and 9a for protection transistor, and a sub-diffused layer 12 are connected to the ground wiring although not shown in the figure.

Next, the present invention will be described in terms of sectional structures of the input/output protection part by reference to FIG. 1B. First, a P conductivity type well layer 14 is formed in the surface region of an N conductivity type silicon substrate, for example, as shown in FIG. 1B. Here, the impurity concentration of the well layer 14 is set to be about $10^{17}$ atoms/cm$^3$. On the surface of the well layer 14, trench isolation regions 15 and 15a are formed selectively for element isolation. Then, back gate resistors 16 and 16a are formed in the well layer 14 below the trench isolation regions 15 and 15a. The resistance of the back gate resistor 16 or 16a can be adjusted by controlling the depth of the trench isolation region 15 or 15a.

In FIG. 1B, the drain diffused layers 4, 4a and 11, and the source diffused layers 6 and 6a of the trigger MOSFETs and the protection MOSFETs are N conductivity type impurity diffused regions. The sub-diffused layer 12 is a P conductivity type impurity diffused region. As shown in FIG. 1B, the drain diffused layers are connected to the input/output terminal 1, and the respective gate electrodes 5, 5a, 9, and 9a, and the source diffused layers and the sub-diffused layers are connected to the ground GND.

Although the trigger MOSFET and the protection MOSFET are illustrated to have comparable sizes in FIG. 1, in reality the size of the protection MOSFET is designed to be larger than the trigger MOSFET, so that the drive capability of the protection MOSFET is very much increased compared with that of the trigger MOSFET.

Next, an example of different sectional structure of the input/output protection part will be described schematically by reference to FIG. 2. Here, the same components as those in FIG. 1 will be indicated by the same reference numerals. This example is the case in which the protection MOSFET can function also as an output buffer region of a silicon substrate 13a of P type conductivity. Here, the impurity concentrations of the silicon substrate 13a and the well layer 14 are set to be about $10^{16}$ atoms/cm$^3$ and $10^{17}$ atoms/cm$^3$, respectively. Then, trench isolation regions 15 and 15a are formed on the surface of the well layer 14. Next, back gate resistors 17 and 17a are formed between the well layer 14 and the sub-diffused layers 12. The resistance of the back gate resistors 17 and 17a is controlled by the impurity concentration of the silicon substrate 13a.

In FIG. 2, the drain diffused layers 4, 4a and 11, and the source diffused layers 6 and 6a are impurity diffused regions of N type conductivity while the sub-diffused layers 12 are impurity diffused regions of P type conductivity. As shown in FIG. 2, the drain diffused layers 4, 4a and 11 are connected to the input/output terminal 1, and the source diffused layers 6 and 6a and the sub-diffused layers 12 are connected to the GND. Moreover, the trigger gate electrodes 5 and 5a are connected to the GND as described in FIG. 1. The gate electrodes 9 and 9a of the protection transistors are connected to the internal circuit, although not shown. In this case, too, the size of the protection MOSFET is made very large and the size of the trigger MOSFET is made small.

Next, referring to FIG. 3, the structure of the trigger MOSFET and the protection MOSFET constituting the electrostatic protection device of this invention, and the structure of the MOSFET for internal circuit constituting the semiconductor device will be described. Here, FIG. 3A is a schematic sectional view of the trigger MOSFET, FIG. 3B is a schematic sectional view of the protection MOSFET and FIG. 3C is a schematic sectional view of the MOSFET for the internal circuit.

Figure 3A:
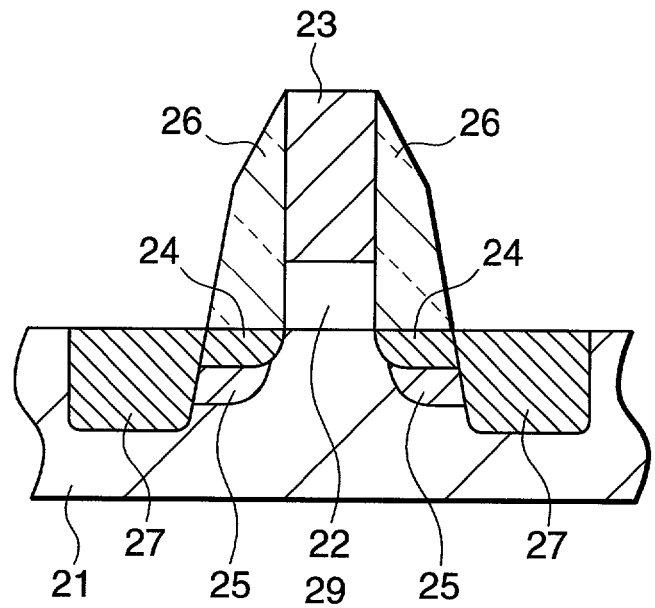
FIGS. 3A, 3B and 3C are schematic sectional views of a MOSFET for trigger and a MOSFET for protection constituting an electrostatic protection device, and a schematic sectional view of a MOS transistor constituting an internal circuit, respectively, of the first embodiment of the invention.
Figure 3B:
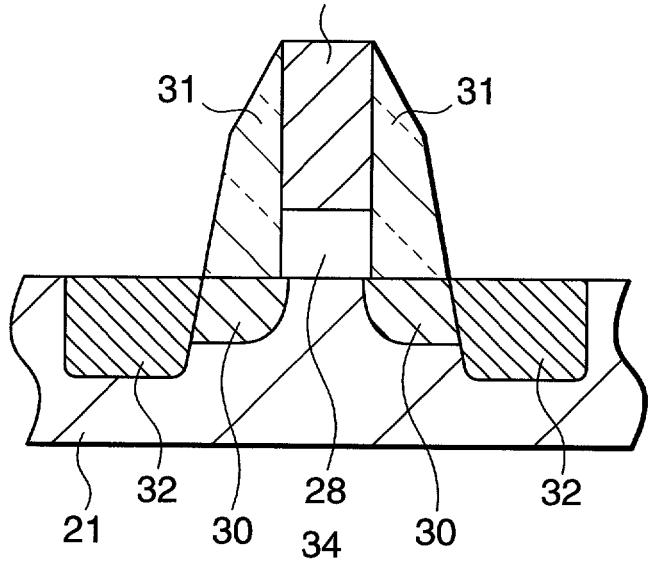
Figure 3C:
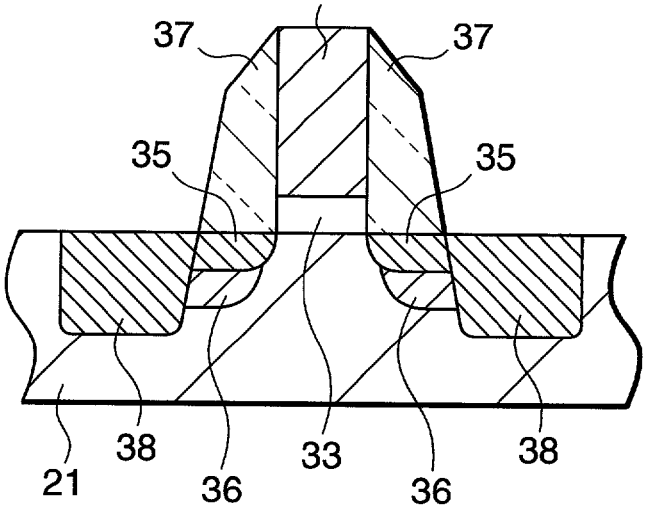

As shown in FIG. 3A, a gate insulation film 22 for trigger of a trigger MOSFET is formed on a silicon substrate 21, of P type conductivity or having a P well layer. Here, the gate insulation film 22 for trigger is an oxynitride film of thickness of about 5 nm, and a gate electrode 23 for trigger with a size of about 0.1 μm in the channel direction is formed on the insulation film 22.

An extended source-drain diffused layer 24 being a first diffused layer is formed almost in self-alignment with the gate electrode 23 for trigger, and a pocket diffused layer 25 is formed below the diffused layer 24. The extended source-drain diffused layer 24 is a shallow region containing a high concentration (for example, $10^{19}$ atoms/cm$^3$) of impurity, phosphorus. The pocket diffused layer 25 is a region containing an impurity, boron, of $10^{18}$ atoms/cm$^3$. The breakdown voltage of the junction formed between the extended source-drain diffused layer 24 and the pocket diffused layer 25 is made small.

A sidewall insulation film 26 is formed on the sidewall of the gate insulation film 22 for trigger and the gate electrode 23 for trigger, and a source-drain diffused layer 27 being a second diffused layer self-aligned with the sidewall insulation film 26, is formed connected to the extended source-drain diffused layer 24. Here, the source-drain diffused layer 27 is a deep region containing a high concentration (for example, $10^{19}$ atoms/cm$^3$) of an impurity, arsenic, and the impurity concentration of the second diffused layer is the same as that of the first diffused layer. In this manner, the basic structure of the trigger MOSFET is completed.

For the protection MOSFET, a gate insulation film 28 for protection transistor of the protection MOSFET is formed on the silicon substrate 21, as shown in FIG. 3B. The gate insulation film 28 has the same material as the gate insulation film 22 for trigger. A gate electrode 29 for protection transistor, having a size of about 0.3 μm in the channel direction is formed on the gate insulation film 28 for protection transistor. Then, an LDD source-drain diffused layer 30 is formed almost in self-alignment with the gate electrode 29 for protection transistor. The LDD source-drain diffused layer 30 is a shallow region which contains a low concentration (for example, $10^{17}$ atoms/cm$^3$) of an impurity, phosphorus or arsenic.

Then, a sidewall insulation film 31 is formed on the sidewall of the gate insulation film 29 for protection transistor and the gate electrode 28 for protection transistor, and a source-drain diffused layer 32 which is in self-alignment with the sidewall insulation film 31 is formed connected to the LDD source-drain diffused layer 30. The source-drain diffused layer 32 is a deep region containing a high concentration (for example, $10^9$ atoms/cm$^3$) of an impurity, arsenic. In this manner, the basic structure of the protection MOSFET is completed.

In the internal circuit MOSFET, its structure is basically the same as that of the trigger MOSFET except that the gate insulation film 33 has a small thickness of 2.5 nm, as shown in FIG. 3C. Namely, a gate electrode 34 for internal circuit is formed on the gate insulation film 33 for internal circuit, an extended source-drain diffused layer 35 is formed almost in self-alignment with the gate electrode 34, and a pocket diffused layer 36 is formed below the diffused layer 35. Then, a sidewall insulation film 37 is formed on the sidewall of the gate insulation film 33 for internal circuit and the gate electrode 34 for internal circuit, and a source-drain diffused layer 38 is formed in self-alignment with the insulation film 37. In this manner, the basic structure of the MOSFET for internal circuit is completed.

Figure 4:
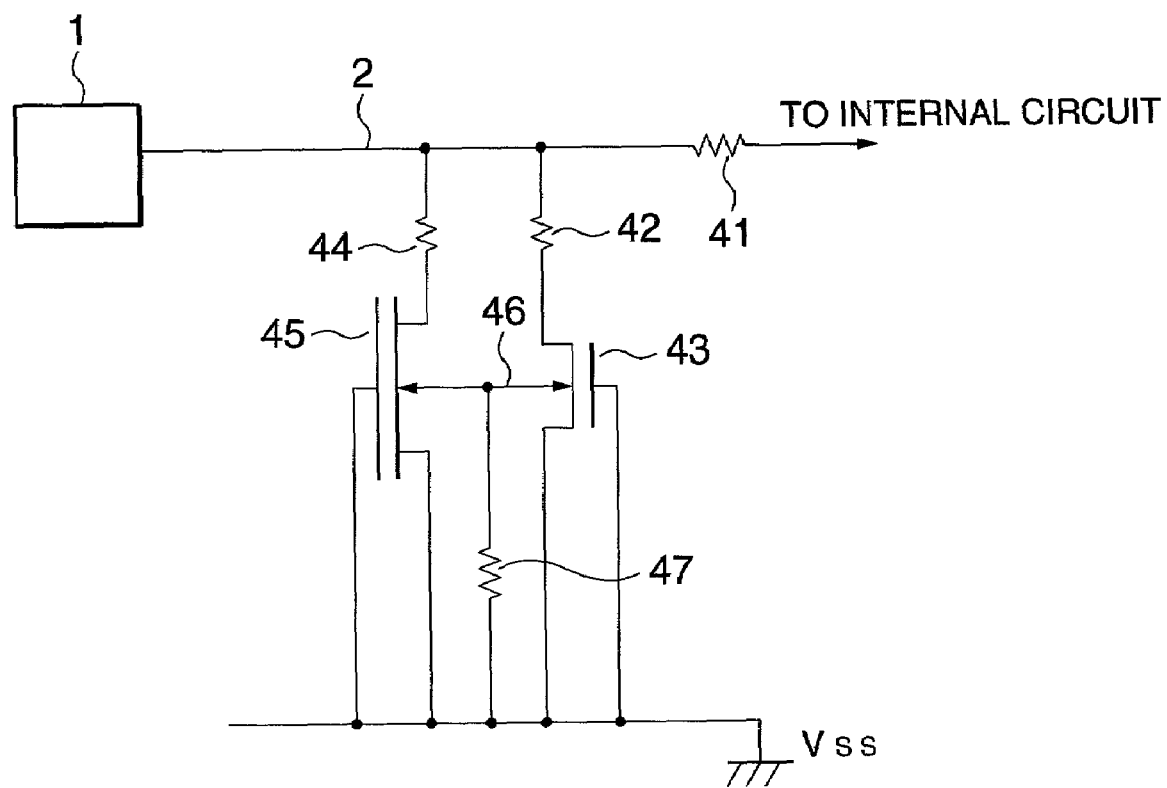
FIG. 4 is an equivalent circuit diagram of the input/output protection part for describing the first embodiment according to the invention.
Figure 5:
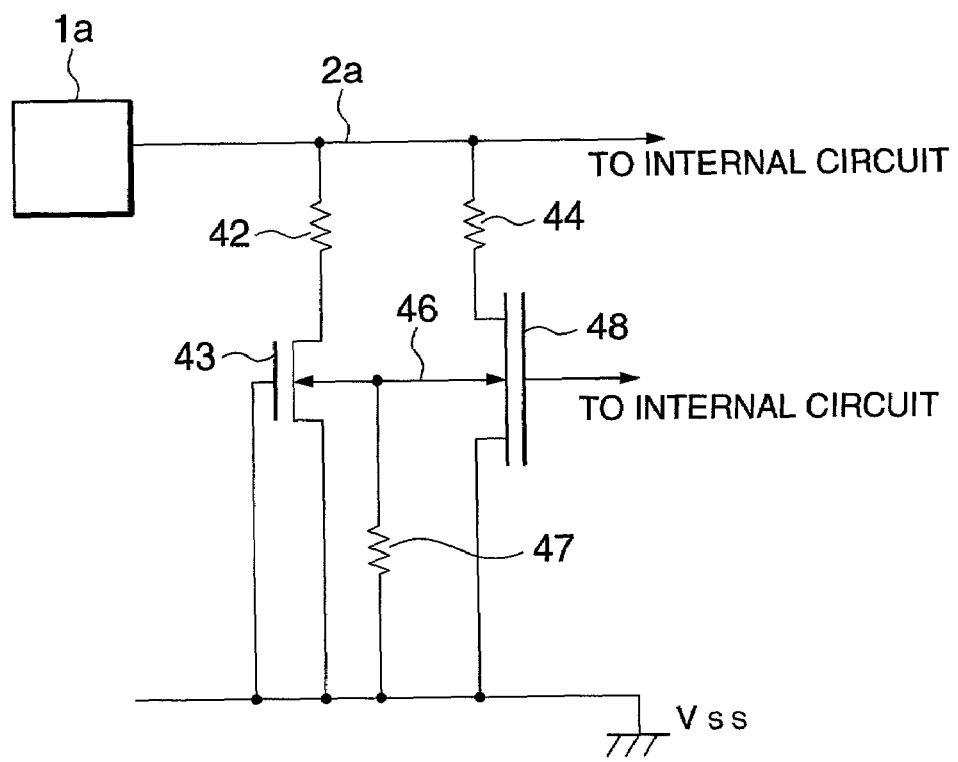
FIG. 5 is another equivalent circuit diagram showing how the first embodiment can be used as an output MOSFET for the internal circuit

Next, the present invention described in the above will be described using the equivalent circuit diagrams of the input/output protection part as shown in FIG. 4 and FIG. 5. As shown in FIG. 4, an input/output wiring 2 is connected to an input/output terminal 1, and the input/output wiring 2 is to be connected to the input gate of a semiconductor device via an input resistor 41. A trigger MOSFET 43 is connected to the input/output wiring 2 and the ground wiring, that is Vss potential, via a resistor 42. The gate of the trigger MOSFET 43 is fixed to the Vss potential.

In addition, the input/output wiring 2 is connected via a resistor 44 to a protection MOSFET 45 being an electrostatic protection transistor, so as to be in parallel with the trigger MOSFET 43. Back gate 46 of the trigger MOSFET 43 is connected to the back gate of the protection MOSFET 45 via the well layer 14. The back gate 46 is connected to the Vss potential via a back gate resistor 47 which corresponds to the back gate resistors 16 and 17 mentioned above. Furthermore, the gate of the protection MOSFET 45 is also connected to the Vss potential As in the above, input/output protection elements are formed in parallel between the input/output wiring 2 that is connected to the internal circuit from the input/output terminal 1, and the Vss potential. These protection elements constitute the input/output protection part.

Here, the input/output terminal may be connected to a power supply in which case the electrostatic protection device functions between the power supply and the ground.

Next, a modification of the present invention as described by reference to FIG. 4, will be described briefly using the equivalent circuit diagram shown in FIG. 5. The difference of the device in FIG. 5 from that in FIG. 4 resides in that the protection MOSFET 45 described in FIG. 4 is used also as an output MOSFET.

As shown in FIG. 5, an output terminal 1a is connected to an output wiring 2a, where the output wiring 2a is connected to the internal circuit of the semiconductor device. Between the output wiring 2a and the Vss potential there is provided the trigger MOSFET 43 via the resistor 42. The gate of the trigger MOSFET 43 is fixed to the Vss potential. Besides, the output wiring 2a is connected via the resistor 44 to an output MOSFET 48 performing also the function of an electrostatic protection transistor, so as to be in parallel with the trigger MOSFET 43. The gate of the output MOSFET 48 is connected to the internal circuit. The rest is the same as in FIG. 4. Namely, the back gate 46 of the trigger MOSFET 43 is connected to the back gate of the output MOSFET 48 via the well layer 14. Moreover, the back gate 46 is connected to the Vss potential via the back gate resistor 47 that corresponds to the back gate resistors 16 and mentioned above.

Next, referring to FIGS. 1 to 5, the operation of the input/output protection part of this invention will be described. When an excessive positive input voltage is applied to the input/output terminal 1 shown in FIG. 1, first, the trigger MOSFET operates in response to the excessive input voltage.

This operation works as follows. Namely, the voltage is applied to the drain diffused layers 4 and 4a via the input/output wiring 1 as shown in FIG. 1 or FIG. 2, and breakdown takes place at the junction part of the extended source-drain diffused layer 24 and the pocket diffused layer 25 of the trigger MOSFET 43 described in FIG. 3. This breakdown produces a large number of holes. Since these holes raise the potential of the well layer 14 to the positive side, the threshold voltage of the trigger MOSFET 43 is lowered, and electrons flow from the source diffused layer 6 toward the drain diffused layer 4. This flow of the electrons leads to further generation of the holes through impact ionization.

The holes generated by the trigger MOSFET 43 cause further rise in the potential of the well layer 14. As a result, the protection MOSFET (or the output MOSFET) is activated uniformly to cause bipolar operation, and the main discharge against the excessive input voltage becomes to be performed through the protection MOSFET 45.

This operation proceeds as follows. The holes mentioned above accumulate in a large quantity in the well layer 14 that functions as the back gate. Part of them diffuse in to the silicon substrate 13 or flow to the ground wiring 8 through the source diffused layer 6. If the area of the source diffused layer 6 is small, majority of them recombine with the electrons in the well layer 14 or flow to the ground wiring 8 through sub-diffused layers 12 that have a large area. If the resistance of the back gate resistor 16 or 17 shown in FIG. 1 or FIG. 2 is large, the amount of the flow-out of the holes through the sub-diffused layers 12 is suppressed, and the protection MOSFET 45 performs a uniform bipolar operation. In other words, the potentials of the portions of the well layer 14 directly below the gate electrodes 9 and 9a for protection transistor as shown in FIG. 1 or FIG. 2 become high toward the positive side. As a result, the lateral NPN transistors having the source diffused layers 6 and 6a as the emitters, the drain diffused layer 11 as the collectors, and the well layer 14 portions directly below the gate electrodes 9 and 9a for protection transistor as the bases, start uniformly to establish a conduction state. That a homogeneous (uniform) start is possible is due to the fact that the bipolar operation is started and the snap-back breakdown takes place prior to the occurrence of the avalanche breakdown at the drain diffused layer 11 of the protection MOSFET.

In this manner, now the electrons are injected from the source diffused layer (emitter) 6 to the base region and flow into the drain diffused layer (collector) 11. In this case, too, holes are produced by the impact ionization of the electrons, and the base region is made further positive in potential. Due to the influence of such a positive feedback and to the fact that the protection MOSFET 45 that operates as an NPN transistor is designed to have a much larger size compared with the trigger MOSFET 43, a large surge current flows through the protection MOSFET 45. Thus, the discharge dealing with an excessive input voltage is carried out almost exclusively through the protection MOSFET Note that such a surge current flows takes place by selecting a low resistance path. For this reason, the sum of the resistance per unit channel width and the (additional) resistance 42, of the trigger MOSFET 43 which is under bipolar operation due to an excessive input voltage that is applied to the input/output terminal 1, is desired to be set larger than the sum of the resistance per unit channel width and the (additional) resistance 44, of the protection MOSFET 45 (or the output MOSFET 48). For this purpose, the distance from the end part of the drain contact hole 3 to the end part of the trigger gate electrode 5 of the trigger MOSFET is set to be larger than the distance from the end part of the drain contact hole 10 to the end part of the gate electrode 9 for protection transistor of the protection MOSFET 45 (or the output MOSFET 48). In other words, the effective distance of the electrode wirings between the drain and source of the trigger MOSFET 43 is set to be larger than the effective distance between the drain and the source of the protection MOSFET 45 (or the output MOSFET 48). In the equivalent circuit in FIG. 4 or FIG. 5, the resistance 42 is larger than the resistance 44.

As described in the above, when an excessive input voltage is applied to the input/output terminal in this invention, the trigger MOSFET with smaller size constituting the input/output protection part is operated first, then the protection MOSFET (or the output MOSFET) is started uniformly to carry out discharge under bipolar operation. In this case, the trigger MOSFET mainly plays the role of starting the protection MOSFET (or the output MOSFET) uniformly, and its discharge capability against the excessive input voltage is low. The discharge against the excessive input voltage is taken care of mainly by the protection MOSFET (or the output MOSFET) which becomes a low resistance path.

Because of this, in this invention, even in the protection MOSFET having a large size, the bipolar operation takes place uniformly differing from the case of the first prior art. Accordingly, the local electrostatic breakdown of the MOS transistor caused by the nonuniformity described in connection with the prior art will never arise. Moreover, the breakdown of the gate insulation film of the MOS transistor which occurred frequently in the first prior art will not occur. This is because the duration of application of the voltage to the gate insulation film of the trigger MOSFET is only momentary, so the quantity of the holes accumulated in the gate insulation film is small. It is also due to the fact that the thickness of the gate insulation film of the MOS transistor constituting the electrostatic protection device is larger than the thickness of the gate insulation film of the MOS transistor constituting the internal circuit.

Moreover, in this invention, the breakdown of the trigger MOSFET occurs at smaller applied voltages compared with the conventional technology, namely, the second prior art. This voltage can be made lower than the breakdown voltage of the gate insulation film of the MOS transistor constituting the internal circuit. Accordingly, the situation as seen in the second prior art will not occur, and the internal element is protected completely in this invention by the protection element.

Moreover, in this invention, the gate voltages of the trigger MOSFET and the protection MOSFET constituting the input/output protection part are fixed to the ground potential. Because of this, the dielectric breakdown of the gate insulation film of the protection element as observed in the third prior art is reduced to a large extent.

Moreover, in this invention, the protection MOSFET can also be applied to the output buffer of the semiconductor device. The output buffer circuit occupies a large layout area in the semiconductor device. In this respect, the present invention contributes greatly to the downsizing of the semiconductor device.

The present applicant disclosed a technique for protecting an output transistor and an internal circuit from ESD breakdown in Japanese Patent Applications Laid Open, No. Hei 9-223748. The input/output protection part in this invention consists of a trigger element and a lateral bipolar transistor. The present invention is a further development of the semiconductor protection technique, where the input/output protection part is composed of a trigger MOSFET and a protection MOSFET, and the structure of the trigger MOSFET is devised so as to operate at lower voltages. As a result, the present invention functions effectively as an electrostatic protection device even for semiconductor devices that operate at voltages lower than in the case of the Japanese Patent Applications Laid Open, No. Hei 9-223748.

Figure 6:
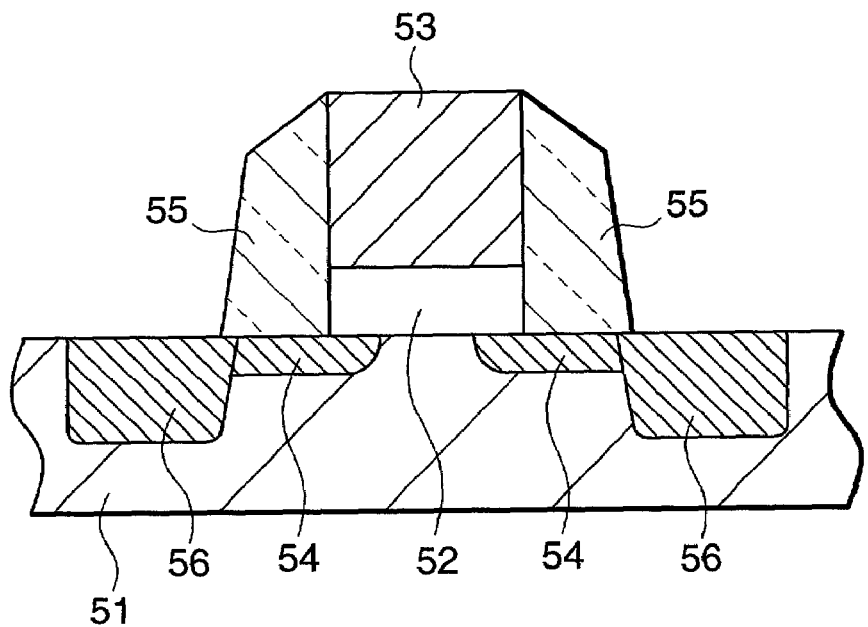
FIG. 6 is a schematic sectional view of a MOSFET for trigger constituting an electrostatic protection device for describing a second embodiment according to the invention.

Next, referring to FIG. 6 to FIG. 8, a second embodiment of the present invention will be described. FIG. 6 shows the sectional structure of a trigger MOSFET constituting an input/output protection part. In this case, the protection MOSFET constituting the input/output protection part and the internal circuit MOSFET have the same structures as shown in FIG. 3B and FIG. 3C, respectively. The second embodiment is characterized in that the holes by the trigger MOSFET are generated through inter-band tunneling as will be described later.

As shown in FIG. 6, a gate insulation film 52 of the trigger MOSFET is formed on a silicon substrate 51 of P type conductivity or a P well layer formed in it. The gate insulation film 52 for trigger is an oxynitride film with thickness of about 2.5 nm. A gate electrode 53 for trigger having a size of about 0.5 μm in the channel direction is formed on the gate insulation film 52 for trigger.

An extended source-drain diffused layer 54 of shallow region containing an impurity, arsenic, at a high concentration (for example, $10^{19}$ atoms/cm$^3$) is formed so as to bite deeply into the channel region from the end of the gate electrode 53 for trigger.

Then, a sidewall 55 is formed on the sidewall of the gate insulation film 52 for trigger and the gate electrode 53 for trigger, and a source-drain diffused layer 56 is formed in self-alignment with the sidewall 55 so as to be connected with the extended source-drain diffused layer 54. Here, the source-drain diffused layer 56 is a deep region containing an impurity, arsenic, at a high concentration (for example, $10^{19}$ atoms/cm$^3$). In this manner the basic structure of the trigger MOSFET is completed. This case is characterized by that the overlap amount of the trigger gate electrode 53 and the extended source-drain diffused layer 54 via the trigger gate insulation film 52 is very large. Even in this case, a pocket diffused layer 25 shown in FIG. 3A may also be introduced.

Next, referring to FIG. 7 which shows schematic sectional views arranged in the order of manufacturing processes of a trigger MOSFET, a manufacturing method of a trigger MOSFET with very large overlap mentioned above will be described.

Figure 7A:
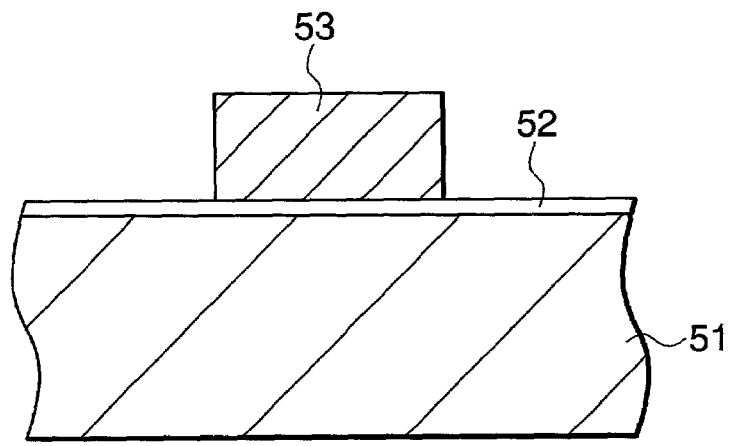
FIGS. 7A, 7B and 7C are respectively schematic sectional views in the order of manufacturing processes of a MOSFET for trigger for describing the second embodiment according to the invention.

As shown in FIG. 7A, a 2.5 nm-thick oxynitride trigger gate insulation film 52 is formed by the known method on a silicon substrate of P conductivity type or a P well layer formed in it. Then, after formation of a polycrystalline silicon film containing an impurity, a trigger gate electrode 53 with a size of about 0.5 μm is formed by a fine processing of the film using photolithography and dry etching.

Figure 7B:
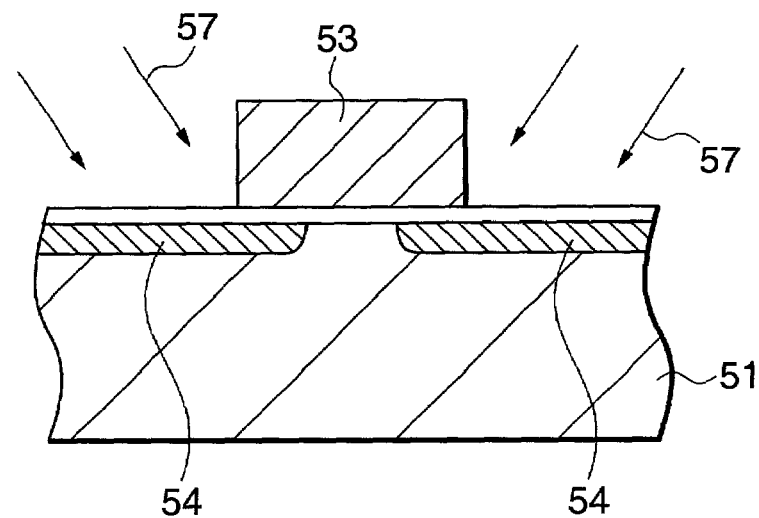

Next, as shown in FIG. 7B, an oblique implantation of arsenic ions is carried out using the trigger gate electrode 53 as a mask. The angle of oblique ion implantation is set to be less than 45 degrees with respect to the surface of the silicon substrate 51. With this arrangement, the impurity, arsenic, can penetrate deep into the channel region of the trigger MOSFET. The energy of the oblique ion implantation is 100 keV, and the dosage is $5\times10^{15}$ atoms/cm$^3$. After subjecting the substrate to a heat treatment, an extended source-drain diffused layer 54 having an impurity concentration of $1\times10^{19}$ atoms/cm$^3$, and a depth of 0.1 μm is formed on the surface of the silicon substrate 51.

Besides, a pocket diffused layer may be added to this by an oblique implantation of boron ions using the trigger gate electrode 53 as a mask.

Figure 7C:
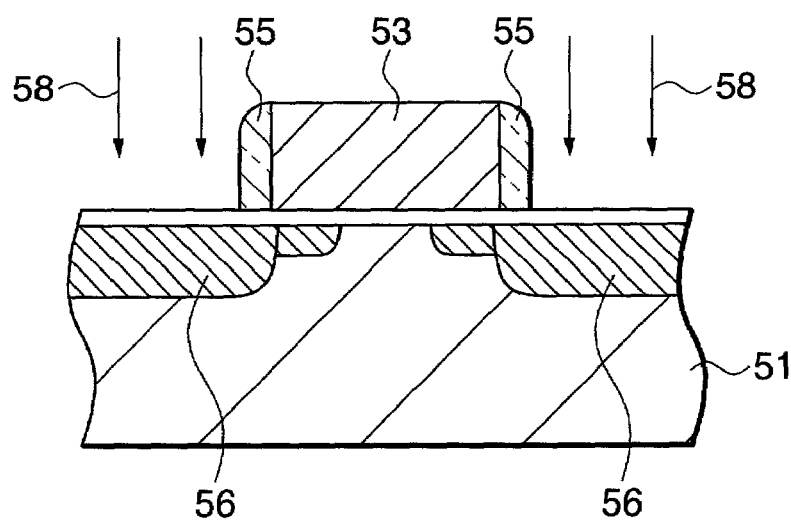

Next, as shown in FIG. 7C, a sidewall insulation film 55 is formed on the sidewall of the trigger gate electrode 53, and a perpendicular implantation of arsenic ions of 100 keV energy and dosage of $5\times10^{15}$ atoms/cm$^3$ is carried out. After subjecting the substrate to a heat treatment, a source-drain diffused layer 56 having an impurity concentration of $2\times10^{19}$ atoms/cm$^3$, and depth of 0.2 μm is formed on the surface of the silicon substrate 51.

Figure 8A:
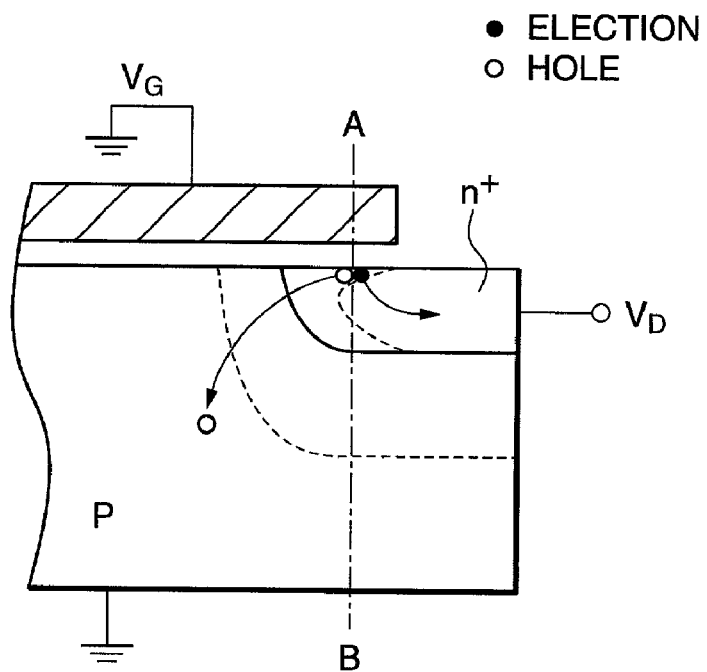
FIGS. 8A and 8B are a sectional view of a MOS transistor and a band diagram for describing interband tunneling phenomenon in the second embodiment according to the invention.
Figure 8B:
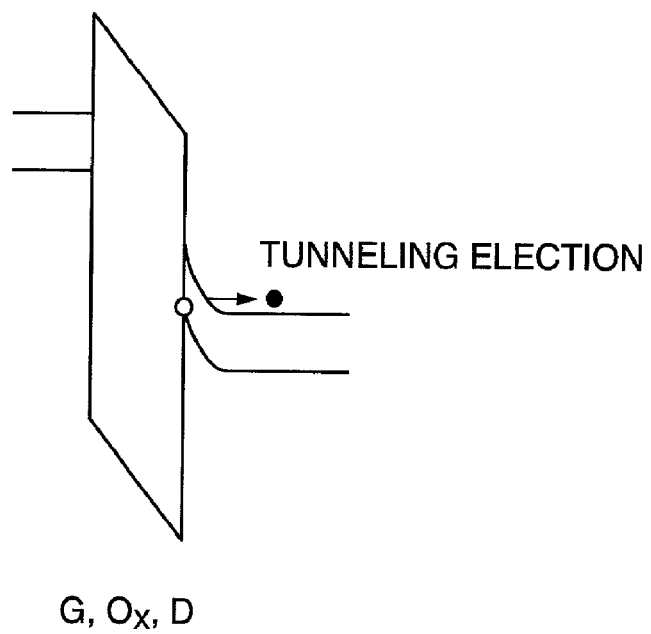
Figure 9A:
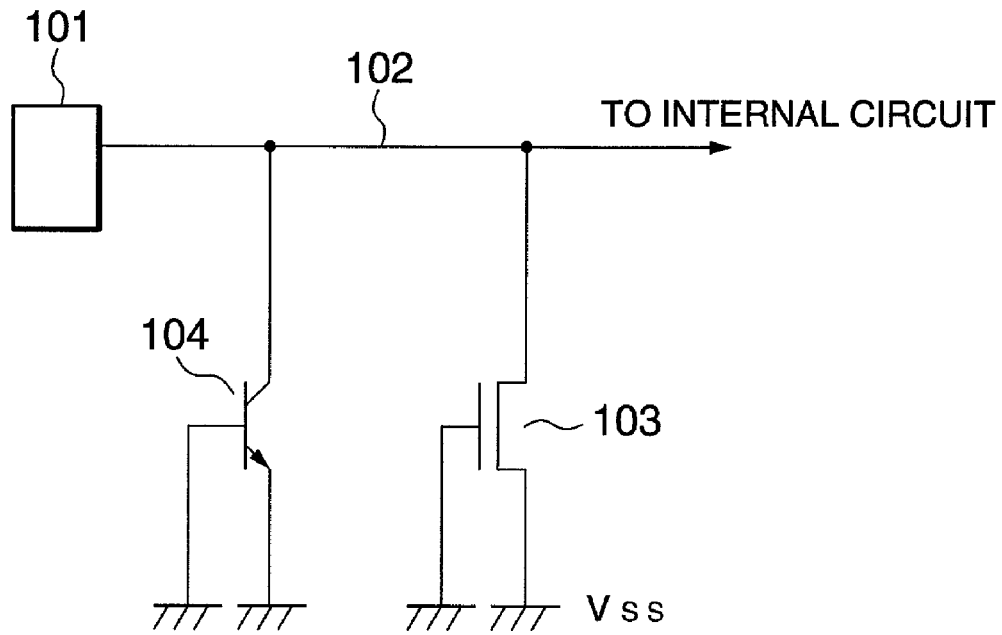
FIGS. 9A and 9B are an equivalent circuit diagram and a sectional view, respectively, of an input protection part for describing a first prior art.
Figure 9B:
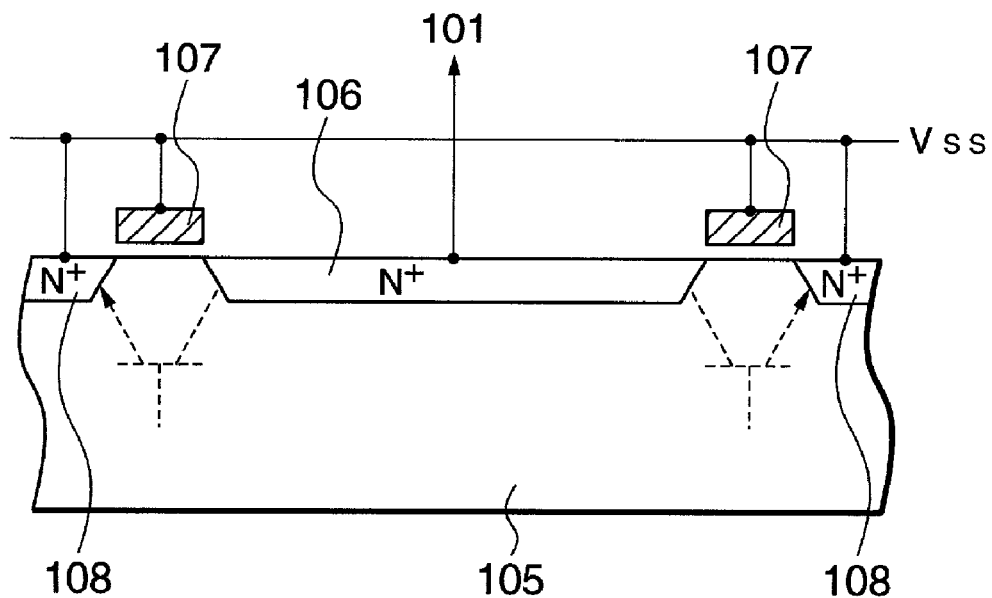
Figure 10:
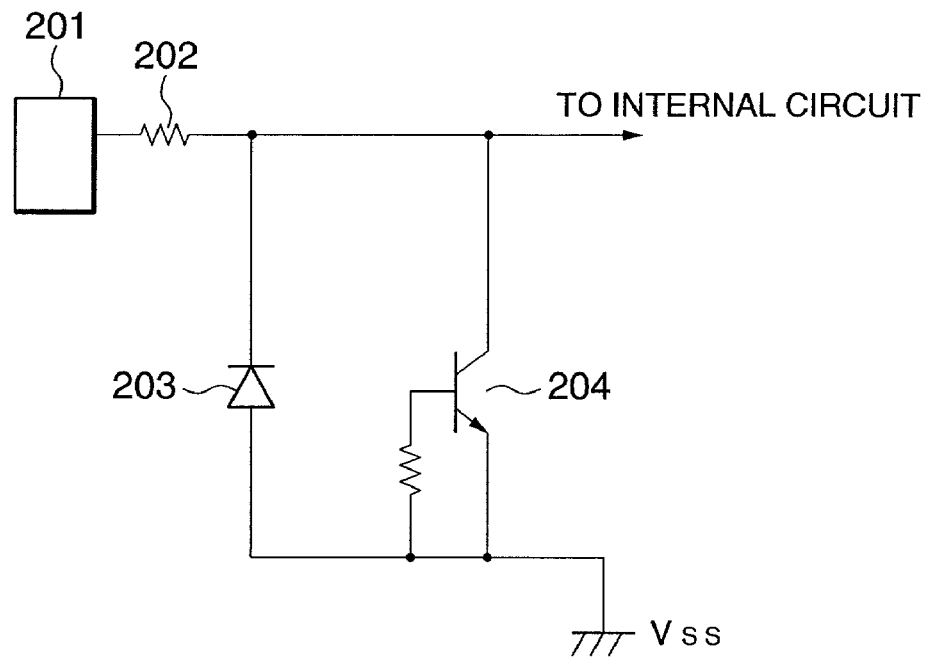
FIG. 10 is an equivalent circuit diagram of an input protection part for describing a second prior art.
Figure 11:
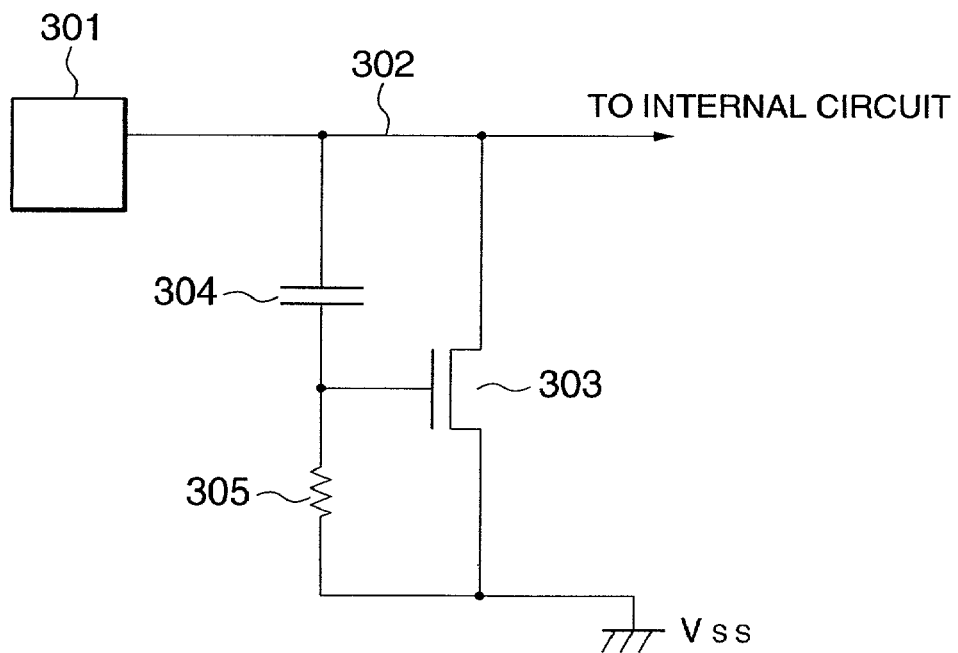
FIG. 11 is an equivalent circuit diagram of an input protection part for describing a third prior art.

When the trigger MOSFET is formed in the input/output protection part described in the first prior art, the starting of the protection MOSFET is caused by the holes generated through the inter-band tunneling. The hole generation phenomenon through the inter-band tunneling will be described by reference to FIG. 8. FIG. 8A is a sectional view of the drain region of an N- channel MOS transistor (NMOS), and FIG. 8B is the band structure of the transistor when cut in the direction A–B indicated in FIG. 8A.

As described in the above, when the gate insulation film of the trigger MOSFET is made thin, in the off-state (state in which the MOS transistor is de-energized) of the gate, a steep bending (referred to as band bending hereinafter) is generated on the surface of the extended source-drain diffused layer which overlaps with the gate electrode with the insulation film in-between, which causes inter-band tunneling of the electrons between the valence band and the conduction band.

As shown in FIG. 8A, the silicon substrate of P conductivity type is connected to the ground potential, and the voltage VG of the gate electrode formed on the substrate via the gate insulation film is also fixed to the ground potential. When a potential VD (corresponding to the excessive input voltage) is applied to the N$^+$ type drain region, pairs of a hole and an electron are generated in a depletion layer of the drain region indicated by the broken lines in the figure. The generated holes flow into the well layer.

The above phenomenon will be described based on the band structure shown in FIG. 8B. In an NMOS, the energy level of electrons in the gate (G) is high, and the energy of the electron decreases from the gate insulation film (Ox) toward the drain (D). When the gate insulation film (Ox) becomes thin as mentioned in the above, the band bending of the drain (D) region becomes steep as shown in the figure. Because of this, electrons in the valence band migrate to the conduction band by tunneling, leaving holes in the valence band. These holes are accumulated in the well layer as mentioned above.

The holes generated in this way activate the protection MOSFET constituting the input/output protection part and facilitate ESD in the same way as described in the first prior art.

In the second prior art, an effect similar to that described in connection with the first prior art will also be generated. Moreover, in this case, it is possible to generate holes at voltages lower than those in the case of the first prior art, so that it is possible to cope satisfactorily with the lowering trend of the operating voltage of the semiconductor devices.

In the prior art, the case of forming the input/output protection part using the NMOS has been described. It should be mentioned here that the present invention is also applicable to the case of P-channel MOS transistor (PMOS). In that case, the conductivity type of the NMOS need only be reversed, and the majority carrier is changed to the electron.

Moreover, the input/output protection part may have a structure in which an input/output protection part constituted by the PMOS and an input/output protection part constituted by the PMOS are connected in series.

Furthermore, the layout of the input/output protection part according to the present invention need not be limited to the layout shown in FIG. 1. A layout may be given in which the trigger MOSFET and the protection MOSFET are arranged alternately. The technological concept of the present invention is that when an excessive voltage is input, the trigger MOSFET is operated first, then the trigger MOSFET activates the protection MOSFET uniformly to facilitate ESD. A layout of any kind that introduces the operations described in the above is acceptable.

The present invention is not limited to the embodiments in the above, and the embodiments can be modified appropriately within the technical scope of the invention.

As described in the above, in this invention, when an excessive input voltage in the form of a pulse of high voltage is applied to an input/output terminal, a trigger MOSFET constituting an electrostatic protection device is operated first to generate majority carriers (for example, the holes) in a semiconductor substrate having a well layer or the like. Next, the majority carriers activate uniformly the protection MOSFET with high drive capability to induce an ESD. Here, the trigger MOSFET is given a structure in which the operation can be generated at low voltages. Moreover, the thickness of the gate insulation film of the trigger MOSFET and the protection MOSFET is made larger than that of a MOS transistor constituting the internal circuit.

Because of this, the breakdown due to ESD of the electrostatic protection device is reduced to a large extent in this invention. Moreover, the electrostatic protection device of this invention is made to operate satisfactorily even for a static electrification of low voltage, so that it is possible to protect completely a semiconductor element of an internal circuit, which is being made the more refined lately, from electrostatic breakdown.

Finally, according to the present invention, the electrostatic protection device can be given a circuit structure of minimum pattern area, and the downsizing of the semiconductor device can be facilitated.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An electrostatic protection device provided between an input/output terminal and an internal circuit of a semiconductor device, comprising:

a first metal oxide semiconductor field effect transistor (MOS transistor); and a second MOS transistor connected mutually in parallel between an input/output wiring connected to said input/output terminal and an electrode wiring of a prescribed voltage such that a back gate of said first MOS transistor and a back gate of said second MOS transistor are mutually interconnected through a resistance to said electrode wiring and a source and a gate of said first MOS transistor and a source of said second MOS transistor are connected to said electrode wiring without intervention of said resistance, wherein said first MOS transistor and said second MOS transistor comprise MOS transistors of the same channel type, said second MOS transistor has a higher drive capability than said first MOS transistor, and the electrostatic protection device is formed such that its operation is triggered by said first MOS transistor, wherein a sum of a resistance per unit channel width during operation of said first MOS transistor under application of an excessive input voltage to said input/output terminal and an additional resistance which is in series with said first MOS transistor is larger than a sum of a resistance per unit channel width during operation of said second MOS transistor and an additional resistance which is in series with said second MOS transistor.

2. The electrostatic protection device according to claim 1, wherein said first MOS transistor has an extended source-drain diffused layer projecting from the source-drain region with a conductivity type equal to the source-drain region and a depth shallower than the source-drain region so that a breakdown voltage of said first MOS transistor is smaller than a breakdown voltage of said second MOS transistor, and the electrostatic protection device is formed such that its operation is triggered by said first MOS transistor.

3. The electrostatic protection device as claimed in claim 1, wherein said first MOS transistor and said second MOS transistor are formed adjacent to each other in a same well layer provided in a semiconductor substrate that supports said semiconductor device.

4. The electrostatic protection device as claimed in claim 1, wherein said first MOS transistor and said second MOS transistor have a gate insulation film which is thicker than that of a MOS transistor comprising said internal circuit.

5. The electrostatic protection device as claimed in claim 1, wherein a gate of said second MOS is connected to said internal circuit, said second MOS transistor thereby functioning also as an output buffer circuit of the semiconductor device.

6. The electrostatic protection device as claimed in claim 2, wherein the extended source-drain diffused layer has a same impurity concentration as the source-drain region.

7. The electrostatic protection device as claimed in claim 2, wherein a pocket diffused layer is formed below the extended source-drain diffused layer, and the pocket diffused layer is higher in impurity concentration than a semiconductor substrate supporting said semiconductor device, a conductivity type of said pocket diffused layer being opposite to a conductivity type of said extended source-drain.

8. The electrostatic protection device as claimed in claim 6, wherein a tunneling of electrons between bands takes place in a surface region of the extended source-drain diffused layer that overlaps via a gate insulation film with the gate electrode of said first MOS transistor.

9. The electrostatic protection device as claimed in claim 1, wherein a source-drain diffused layer of said second MOS transistor is formed in a lightly doped drain (LDD) structure.

10. The electrostatic protection device as claimed in claim 1, wherein a channel length of said first MOS transistor is shorter than a channel length of said second MOS transistor.

* * * * *